US005801533A

United States Patent [19]

Kalb, Jr.

[11] Patent Number: 5,801,533
[45] Date of Patent: Sep. 1, 1998

[54] METHOD AND APPARATUS WITH CASCODE BIASING MAGNETO FIELD EFFECT TRANSISTORS FOR IMPROVED SENSITIVITY AND AMPLIFICATION

[75] Inventor: Jeffrey C. Kalb, Jr., Phoenix, Ariz.

[73] Assignee: Intel Corporation, Santa Clara, Calif.

[21] Appl. No.: 718,638

[22] Filed: Sep. 17, 1996

[51] Int. Cl.$^6$ ............... G01R 33/02; G01R 33/06; H01L 27/22
[52] U.S. Cl. ............... 324/252; 324/251; 327/510
[58] Field of Search ............... 324/244, 249, 324/251, 252, 260; 327/510, 511

[56] References Cited

U.S. PATENT DOCUMENTS

| | | |
|---|---|---|
| 4,100,563 | 7/1978 | Clark . |
| 4,677,380 | 6/1987 | Popovic et al. .......... 324/252 |
| 4,683,429 | 7/1987 | Popovic . |
| 4,700,211 | 10/1987 | Popovic et al. . |
| 4,710,704 | 12/1987 | Ando . |
| 4,893,073 | 1/1990 | McDonald et al. . |
| 4,926,116 | 5/1990 | Talisa . |
| 5,153,557 | 10/1992 | Partin et al. . |
| 5,247,278 | 9/1993 | Pant et al. . |
| 5,292,342 | 3/1994 | Nelson et al. . |
| 5,392,293 | 2/1995 | Hsue . |
| 5,438,990 | 8/1995 | Wahlstrand et al. .......... 324/252 X |
| 5,489,846 | 2/1996 | Li et al. .......... 324/252 |

OTHER PUBLICATIONS

"An Evaluation of IDDQ Versus Conventional Testing for CMOS Sea-of-Gate IC'S", K. Sawada and S. Kayano, *ASIC Design Engineering Center, Mitsubishi Electric Corporation*, 1992 IEEE.

"IDDQ Testing Makes a Comeback", Dan Ramanchik, *Test & Measurement World*, Oct., 1993, p. 58.

"Built-In Current Testing –Feasibility Study", Wojciech Maly and Phil Nigh, *Department of Electrical and Computer Engineering, Carnegie Mellon University*, 1988 IEEE.

"Master Series IDDQ Product Description-R0.4-Preliminary Jan. 1994", *Master Series IDDQ Monitor*, Copyright 1991/1992, LTX Corporation.

Built-in Current Sensor for IDDQ Test in CMOS, Ching-Wen Hsue and Chih-Jen Lin, *AT&T Bell Laboratories*, 1993 IEEE.

"Circuit Design for Built-In Current Testing", Yukija Miura and Kozo Kinoshita, *Department of Applied Physics, Osaka University*, 1992 IEEE.

"A General Purpose IDDQ Measurement Circuit", Kenneth M. Wallquist, Alan W. Righter and Charles F. Hawkins, *Electrical & Computer Engineering Department, The University of New Mexico*, 1993 International Test Conference.

"IDDQ and Reliability", Robert C. Aitken, *Design Technology Center, Palo Alto, California*, Apr. 26, 1994, Hewlett-Packard.

"IDDQ Background Paper on Sematech/Sandia/UNM Project", Alan Righter & Chuck Hawkins, Apr. 4, 1994, *The University of New Mexico Electrical and Computer Engineering Dept*.

*Primary Examiner*—Gerard R. Strecker
*Attorney, Agent, or Firm*—Blakely, Sokoloff, Taylor & Zafman

[57] ABSTRACT

Cascode coupled magnetic field effect transistors used to measure magnetic field. The disclosed cascode coupled MagFET circuit includes cascode coupled transistors used to equalize the voltage at the drains of the MagFET resulting in a differential Hall current. The cascode devices are biased at a state of very weak inversion to maximize input impedance. The differential currents are amplified with an active current mirror load coupled to the cascode configured devices. A comparator is used to sense the differential currents. The reference voltages used to bias the MagFET and the cascode coupled devices are generated with a bias network including a MagFET precisely matched with the MagFET used to measure the magnetic field such that the magnetic field measuring circuit is exceptionally immune to variations in process, temperature and supply voltage.

20 Claims, 7 Drawing Sheets

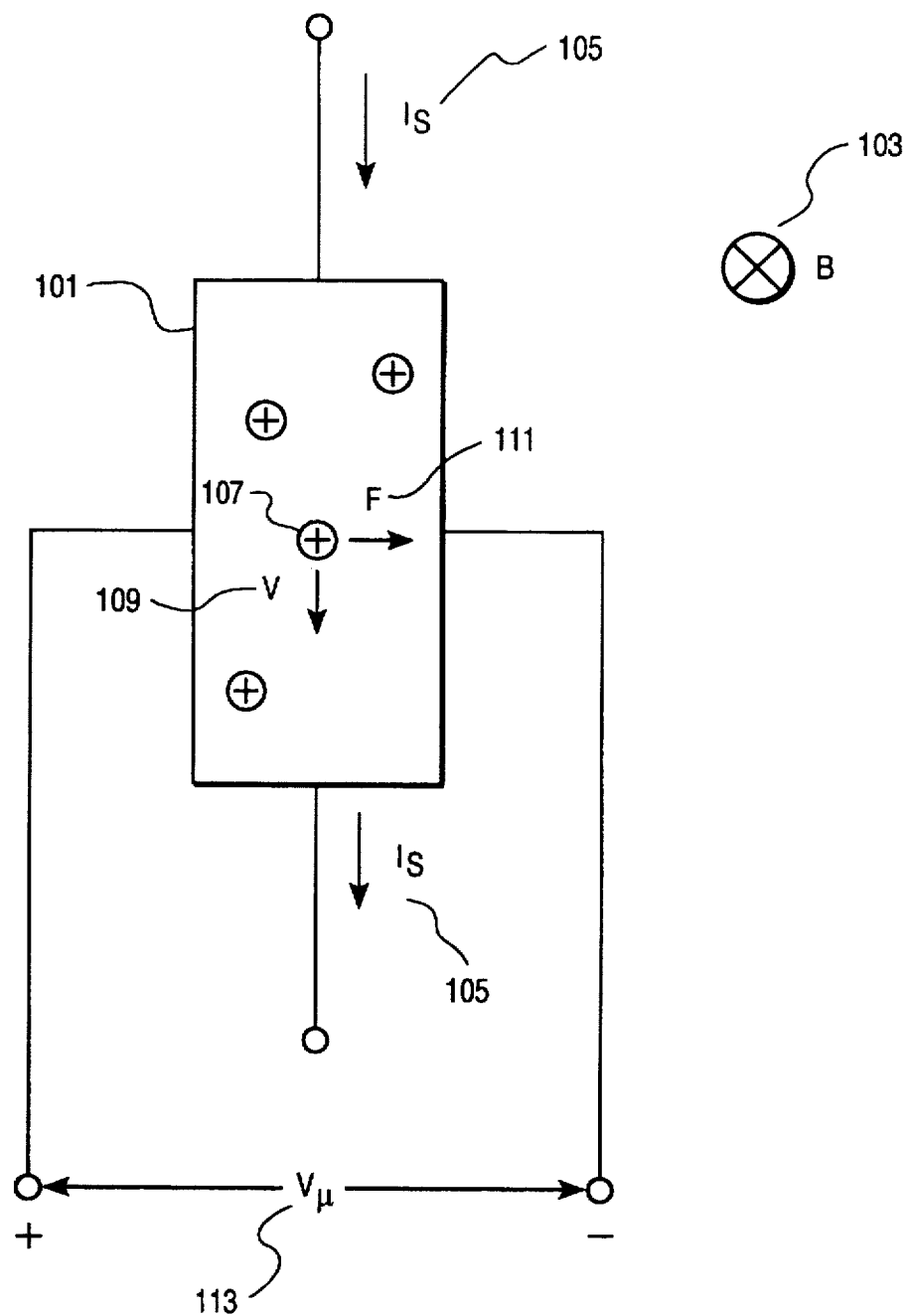
FIG_1 (PRIOR ART)

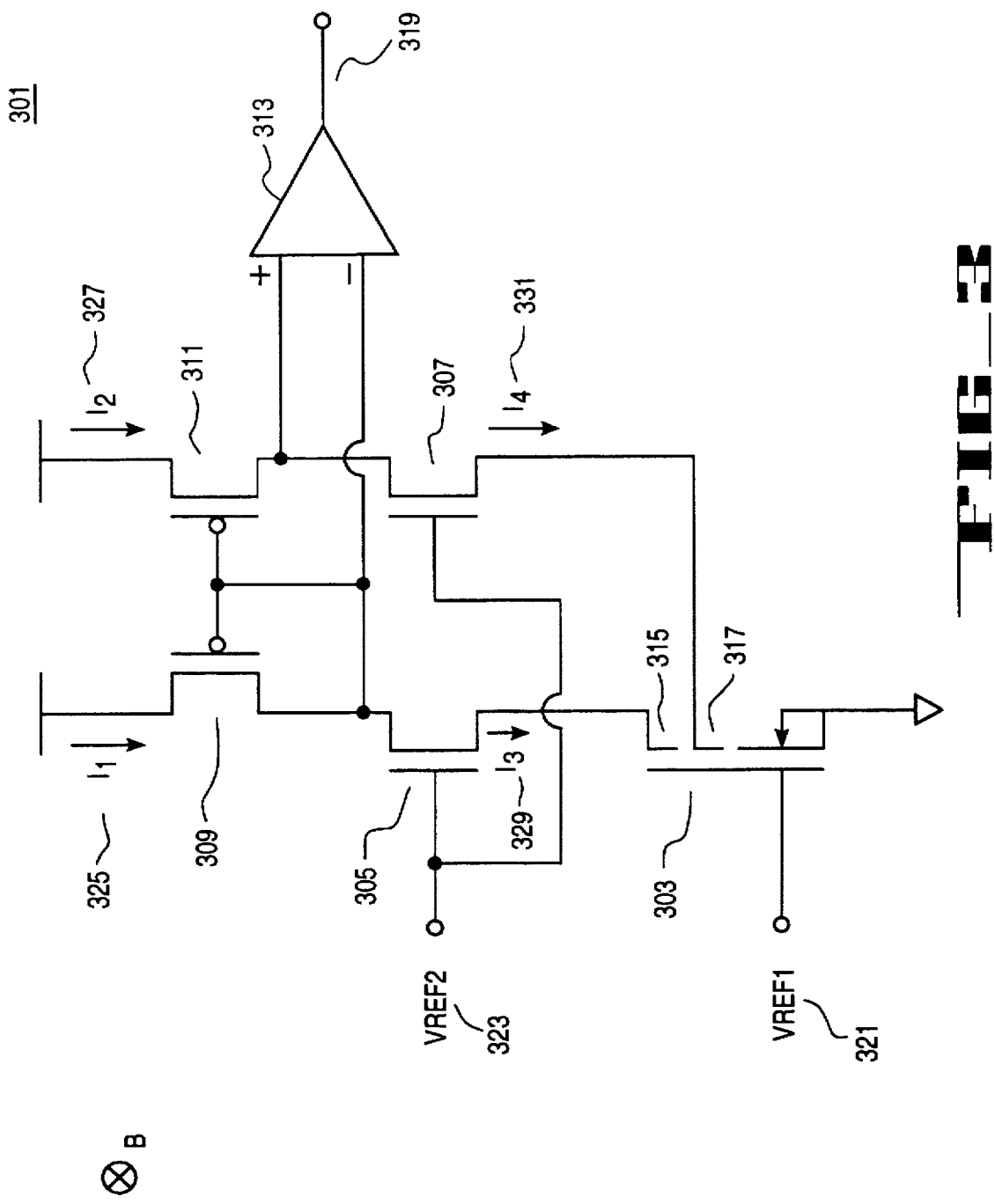
FIG_3

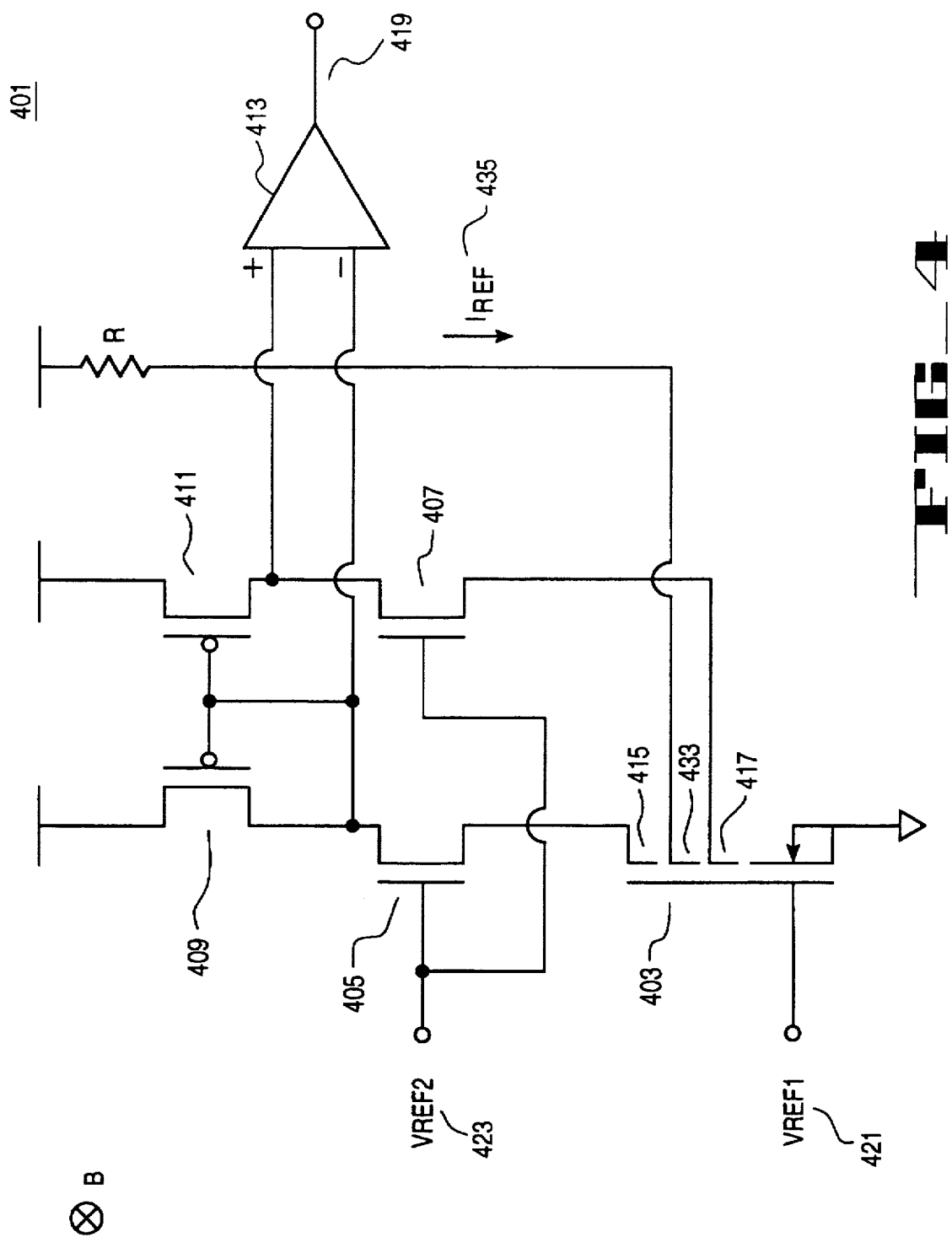
FIG_4

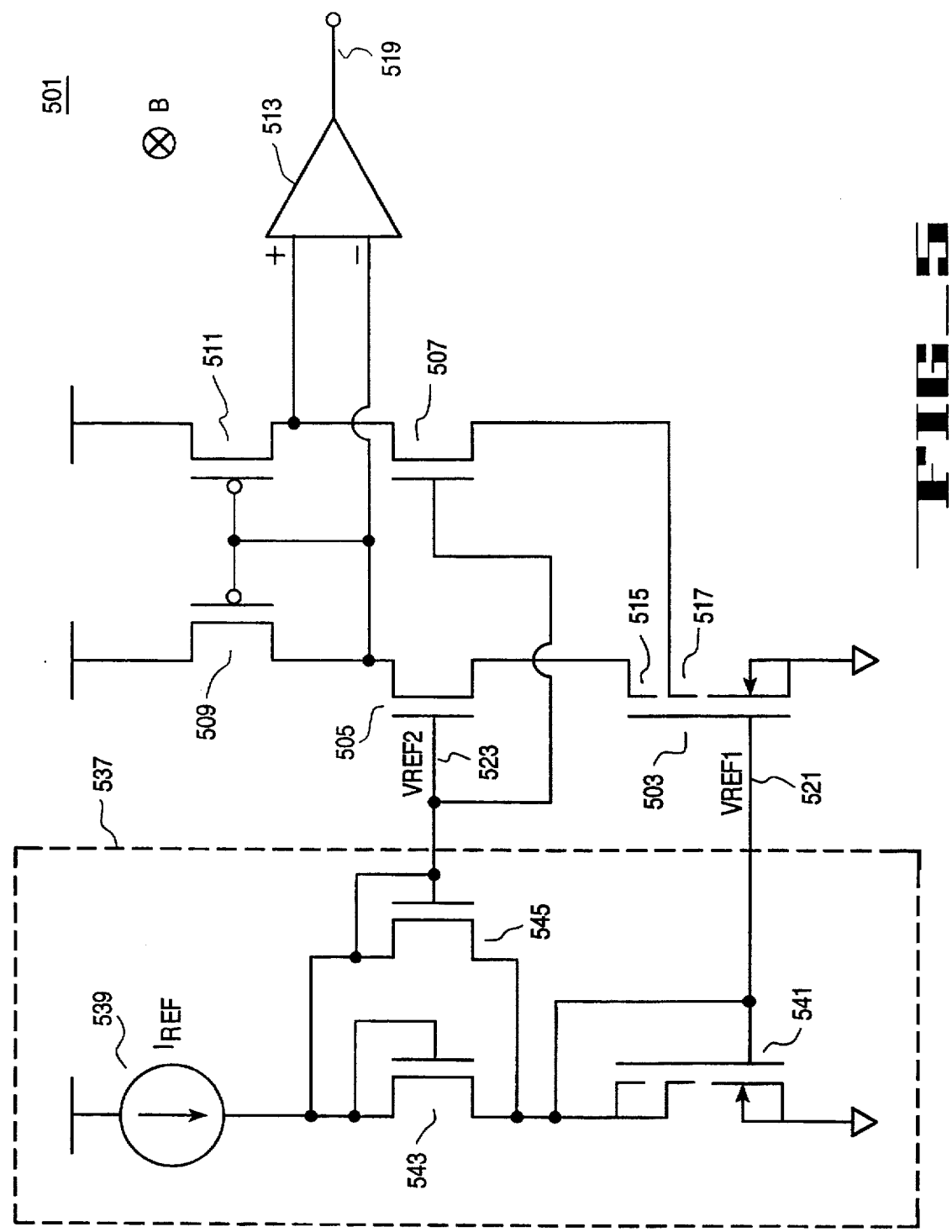
FIG_5

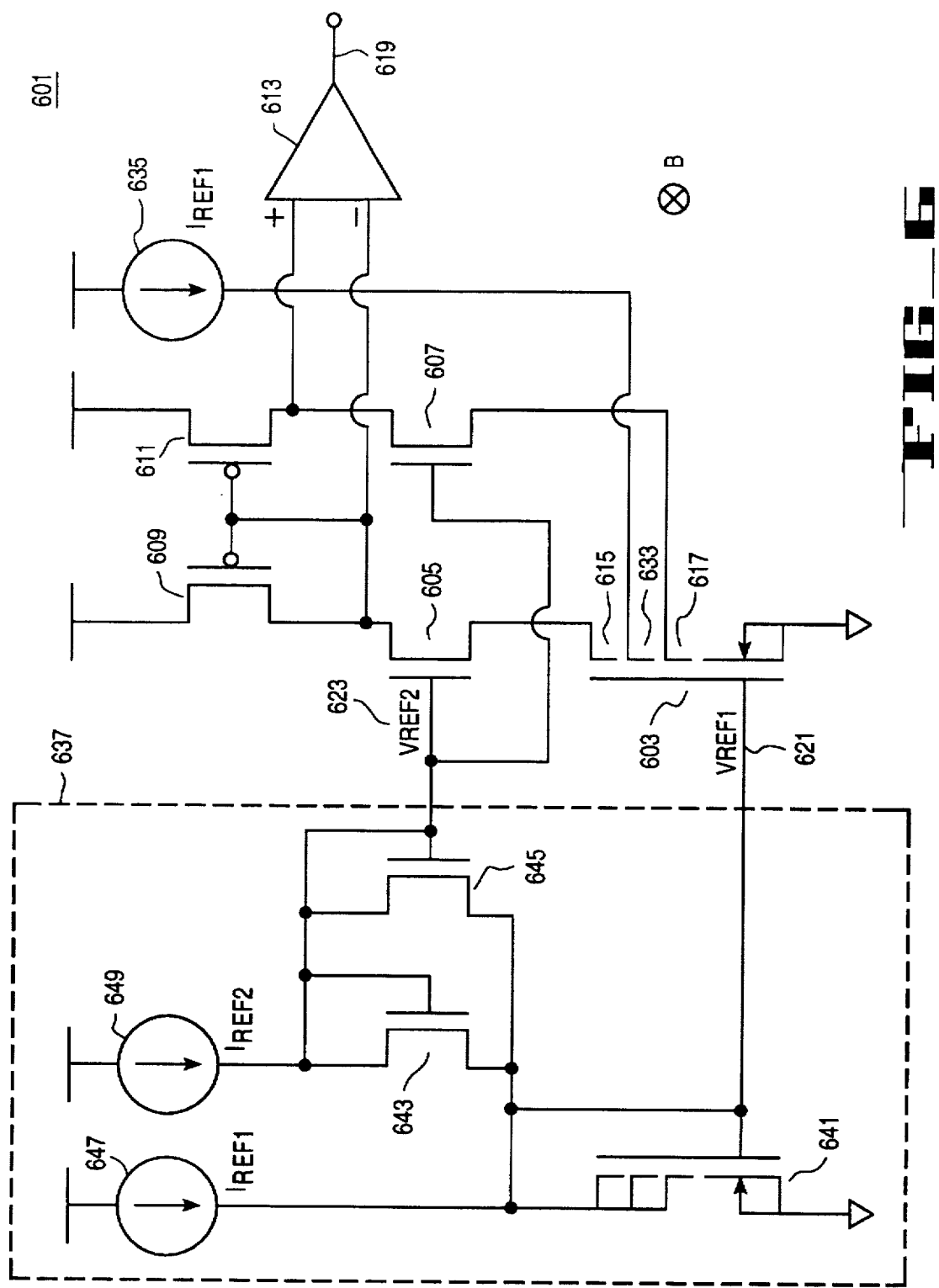
FIG_6

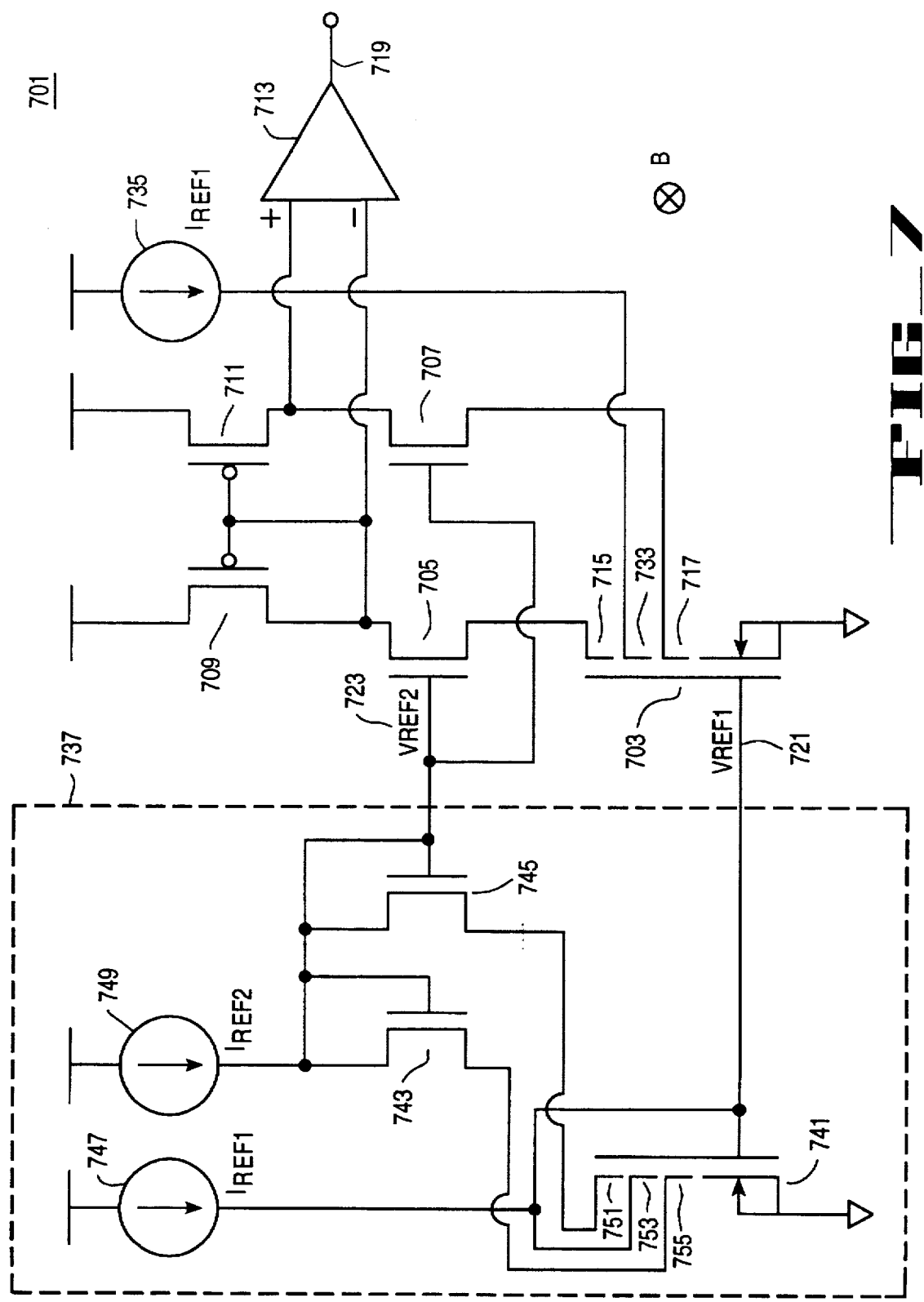
FIG_7

METHOD AND APPARATUS WITH CASCODE BIASING MAGNETO FIELD EFFECT TRANSISTORS FOR IMPROVED SENSITIVITY AND AMPLIFICATION

BACKGROUND OF THE INVENTION

FIELD OF THE INVENTION

The present invention relates generally to magnetic field sensors and more specifically, the present invention relates to magnetic field effect transistors.

DESCRIPTION OF THE RELATED ART

Magnetic field sensors are used in a number of industries today. For example, in the medical industry, magnetic field sensors are useful in magnetic imaging technology. In the electronics industry, magnetic field sensors are used in circuits to measure magnetic fields produced by electric currents or the earth's magnetic field.

A wide variety of types of magnetic field sensors may be used to measure the flux of a magnetic field. Hall Effect magnetic field sensors are presently used in many applications in which it is desired to measure a magnetic flux. These magnetic field sensors convert magnetic flux into a signal in the form of a differential voltage which may then be manipulated in accordance with conventional methods of analog circuit design. An important property of magnetic field sensors is this sensitivity of the sensor to magnetic flux.

FIG. 1 is an illustration of a conductive strip 101 exhibiting the properties of the Hall Effect in response to a magnetic field 103. A sense current $I_s$ 105 flows through the conductive strip 101. Conductive strip 101 contains many charge carriers 107 which flow through conductive strip 101 with a velocity shown as V 109. It is noted that in FIG. 1, charge carrier 107 is shown as a "hole" and therefore flows in the same direction as Is 105. Charge carrier 107 may also be an electron in such a case and would therefore flow in an opposite direction of Is 105, and V 109 would correspondingly point in the opposite direction. With magnetic field B 103, flowing "into the page" in this example, a Lorentz force is exerted upon moving charged carrier 107, shown as F 111 in FIG. 1. The Lorentz force equation is given by the following relationship:

$$F = qV \times B \quad \text{(Equation 1)}$$

Where F is the Lorentz force, q is an electric charge, V is the velocity vector of the moving charge carrier and B is the magnetic field vector. Charge carrier 107 will be deflected from its normal course with an acceleration which is proportional to the charge on the carrier, q, the magnetic field, B 103, and the component of the charge carrier's velocity, V 109, which is perpendicular to the magnetic field. This acceleration will be in a direction perpendicular to both the velocity V 109 of the charge carrier and the magnetic field B 103 at that position in space as determined by the right-hand rule.

If such a magnetic field were to exist within a semiconductor in which a current is flowing, this acceleration will result in a deflected current as a result of the Lorentz force. Such a current would result in a continuous increase in local charge density unless it is compensated by an opposing current. This opposing current is developed due to the electric field which such a charge creates. This acceleration due to electric field will, in the static case, precisely balance the local acceleration due to the Lorentz force. This electric field implies a voltage drop:

$$V_H = \int E \cdot dl \quad \text{(Equation 2)}$$

Where $V_H$ is a Hall voltage and E is the electric field.

In the case of the conductive strip 101 shown in FIG. 1, the Hall voltage $V_H$ may be determined using the following Hall effect relationship:

$$V_H = \frac{I_S B_1}{n q_0 h} \quad \text{(Equation 3)}$$

where $I_s$ is the current, $B_1$ is the magnetic field, n is the density of charge carriers in the conductive strip, qo is the value of an electronic charge which is $1.602 \times 10^{-19}$ coulombs, and h is the thickness of the conductive strip. In accordance with Equation 3, it is observed that the Hall voltage $V_H$ is inversely proportional to the charge carrier density n in the conductive strip and directly proportional to the sense current $I_S$.

One type of magnetic field sensor which utilizes the Hall effect to measure magnetic flux is a magnetic field effect transistor (MagFET). In general, MagFET transistors use the application of a voltage applied to the gate to selectively control the carrier concentration in the conductive channel in the silicon region below the gate. By this means, a transistor may be biased to minimize the carrier concentration n below the gate to produce the largest optimal Hall voltage possible in accordance with Equation 3 above.

FIG. 2A is an illustration of a dual drain MagFET 201 which is used to measure the flux of a magnetic field B 203. Dual drain MagFET 201 includes gate 209, source 211, and two drains 205 and 207. The dual drain MagFET is biased so that two equal currents flow through drains 205 and 207 when no magnetic field is present. When a magnetic field B 203 is present, however, the Lorentz force will deflect the current in such a way as to favor one of the drains at the expense of the other one of the drains. This results either in a differential voltage or current between the two drains 205 and 207. To illustrate, suppose that $I^{r1}$ flows from drain 205 to source 211 and that $I_{S2}$ flows from drain 207 to source 211. If there is no magnetic field B 203, then $I_{S1}$ and $I_{S2}$ will be equal. If there is a magnetic field B 203, then there will be a current differential between $I_{S1}$ and $I_{S2}$.

FIG. 2B shows a triple drain MagFET 251 which is used to measure the flux of a magnetic field B 253. MagFET 251 has a gate 255, source 257 and three drains, center drain 259 and two lateral drains 261 and 263. Triple drain MagFET 251 operates in a manner similar to that of dual drain MagFET 201. The current which is deflected by the Lorentz force, however, flows predominately through center drain 259. Either a voltage or current differential may be measured from the two lateral drains 261 and 263. To illustrate, suppose sense current Is 265 is configured to flow through the central drain 259 to the source 257 as determined by the biasing point of the gate 255. This gate voltage simultaneously determines the carrier concentration of the silicon surface. With the presence of magnetic field B 253, a voltage differential develops between the lateral drains 261 and 263 as a result of the Hall effect.

In general, prior art methods for using dual drain MagFET 201 or triple drain MagFET 251 involve routing the two drains at which the differential voltage is generated in response to the magnetic field to amplification or comparator circuitry. The prior art amplification or comparator circuitry generally amplifies the differential voltage generated at the two drains of the MagFETS and determines if there is a voltage differential. The problem with prior art methods is that the differential Hall voltage generated by the MagFETS is not amplified immediately and therefore leaves open the opportunity for noise to couple into the differential signal. Such noise results from a variety of sources such as power supply noise, other nodes toggling in the integrated circuit as well as capacitive coupling to name a few. In addition, the magnetic field being measured by MagFET sensors is often very small. Accordingly, very small voltage differentials result. By amplifying small differential voltage signals with unwanted noise factored into the signals, the amplified differential signals include an undesirable amount of amplified noise. This condition compromises MagFET sensitivity and reliability.

Therefore, what is desired is a method and apparatus which amplifies immediately the differential Hall voltage generated by a MagFET before there is an opportunity for noise to couple into the signal. Such a method and apparatus would minimize noise and provide optimal MagFET sensing and amplification.

SUMMARY OF THE INVENTION

An apparatus and method for measuring a magnetic field is disclosed. In one embodiment, the gate of a first MagFET is configured to be biased at a first reference voltage. The first and second inputs of a comparison circuit are coupled to the first and second drain of the MagFET. First and second transistors are coupled in a cascode configuration between the first input and the first drain of the MagFET and the second input and the second drain of the MagFET respectively. The gates of the first and second cascode configured transistors are biased at a second reference voltage. Additional features and benefits of the present invention will become apparent from the detailed description, figures and claims set forth below.

DESCRIPTION OF THE DRAWINGS

The present invention is illustrated by way of example and not limitation in the accompanying figures.

FIG. 1 is an illustration of a conductive strip exhibiting the properties of the Hall effect.

FIG. 3 is a schematic of a dual drain MagFET with cascode coupled transistors in accordance with the teachings of the present invention.

FIG. 4 is a schematic of a triple drain MagFET with cascode coupled transistors in accordance with the teaching of the present invention.

FIG. 5 is a schematic of a dual drain MagFET and associated cascode coupled transistors with a biasing network in accordance with the teaching of the present invention.

FIG. 6 is a schematic of a triple drain MagFET with cascode coupled transistors and a biasing network in accordance with the teachings of the present invention.

FIG. 7 is another embodiment of a triple drain MagFET with cascode coupled transistors and a biasing network in accordance with the teachings of the present invention.

DETAILED DESCRIPTION

Figure 2A:
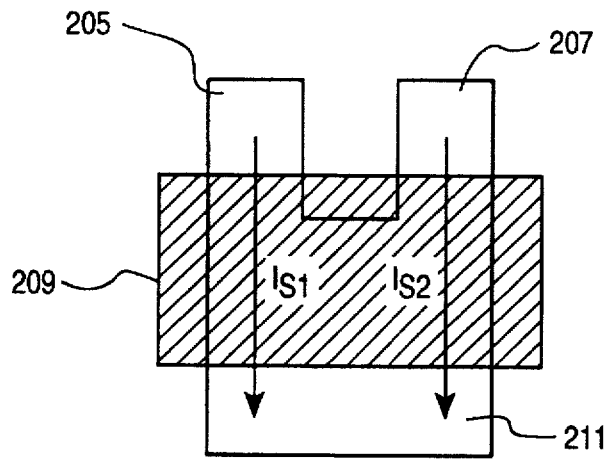
FIG. 2A is an illustration of a prior art dual drain MagFET.
Figure 2B:
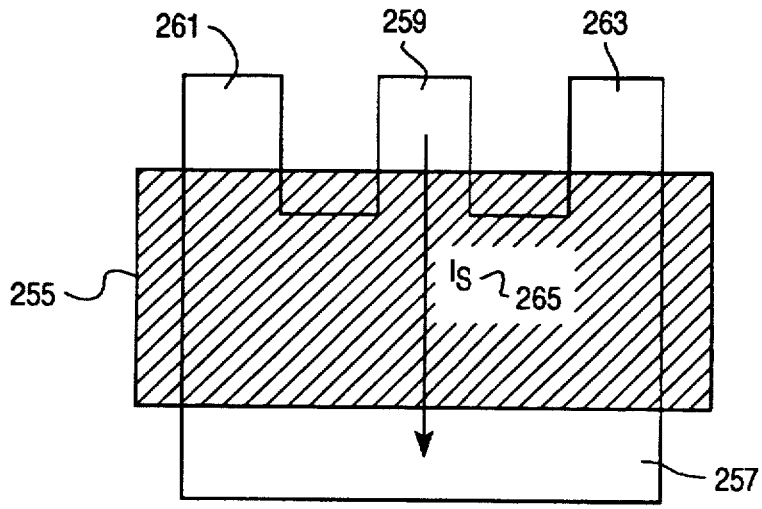
FIG. 2B is an illustration of a prior art triple drain MagFET.

A method and apparatus for measuring a magnetic field using cascode biased magneto field effect transistors (MagFETs) is described. In the following detailed description, numerous specific details are set forth in order to provide a thorough understanding of the present invention. It will be apparent, however, to one having ordinary skill in the art that the specific details need not be employed to practice the present invention. In other instances, well known materials or methods have not been described in order to avoid obscuring the present invention.

The present invention effectively biases cascode devices in a manner in which they may be used optimally in MagFET sensing and amplification. The novel biasing scheme described herein provides optimal cascode biasing over process, temperature, and supply voltage variations. With the cascode coupled devices described herein, the differential Hall voltage of a MagFET is amplified immediately before there is an opportunity for noise to couple into the output differential Hall voltage signal.

FIG. 3 is a schematic of a circuit 301 used to measure magnetic field using a dual drain MagFET 303 with cascode coupled transistors 305 and 307. N-channel transistor 305 is coupled to drain 315 of MagFET 303 and n-channel transistor 307 is coupled to drain 317 of dual drain MagFET 303. In one embodiment of the present invention, p-channel transistors 309 and 311 are coupled in a current mirror configuration such that n-channel transistor 305 is coupled to p-channel transistor 309 and nchannel transistor 307 is coupled to p-channel transistor 311 as shown in FIG. 3. Comparator 313 has two inputs which are coupled to the drains of n-channel transistors 305 and 307 respectively. It is appreciated that p-channel transistors 309 and 311 form an active current mirror load which provides amplification to the differential signal output at the drains of n-channel transistors 305 and 307 respectively. The amplified output is sensed by comparator 313 and an output signal is generated at output 319.

In one embodiment of the present invention, the gate of dual drain MagFET 303 is biased with VREF1 321 to a voltage centered between the differential voltages output at drains 315 and 317 of dual drain MagFET 303. In the embodiment, VREF2 323 biases the gates of n-channel transistors 305 and 307. N-channel transistors 305 and 307 with gates biased by VREF2 323 convert the Hall voltage generated by dual drain MagFET 303 to Hall currents, $I_3$ 329 and $I_4$ 331. The Hall currents 13 329 and $I_4$ 331 result when a dual drain or triple drain MagFET has its lateral drains forced to an identical voltage. In such a case, the Hall voltage which normally is responsible for an electric field is suppressed. The electric field which is thus suppressed is no longer capable of offsetting the Lorentz 20 current in the semiconductor device. Thus, this current must find a path in which it can leave the MagFET or else charge will build up, resulting in such a differential voltage which is suppressed in circuit 301. Cascode coupled n-channel transistors 305 and 307 force the voltage at the drains dual drain MagFET 303 to identical voltages. In the embodiment shown in FIG. 3, drains 315 and 317 are both forced to a threshold voltage less than VREF2 323 through cascode coupled n-channel transistors 305 and 307 respectively. Consequently, differential currents $I_3$ 329 and $I_4$ 331 result. In the embodiment shown in FIG. 3, $I_3$ 329 equals I+$\Delta$ while $I_4$ 331 equals I−$\Delta$.

$I_3$ 329 acts as a program current for the current mirror comprised of p-channel transistors 309 and 311. Accordingly, $I_1$ 325 is programmed to be equal to I+$\Delta$. As shown in FIG. 3, $I_1$ 325 flows through the current path on the left hand side of FIG. 3. Since p-channel transistors 309 and 311 are coupled together in a current mirror configuration as shown in FIG. 3, $I_2$ 327 mirrors $I_1$ 325 and is therefore also equal to I+$\Delta$. With $I_1$ 325, $I_2$ 327 and $I_3$ 329 all equal to I+$\Delta$ and $I_4$ 31 equal to only I−$\Delta$, comparator 313 coupled to the drains of n-channel transistors 305 and 307, respectively, detects the differential Hall currents and outputs a corresponding signal at output 319.

FIG. 4 is a schematic of a circuit 401 featuring triple drain MagFET 403 and cascode coupled n-channel transistors 405 and 407. Circuit 401 of FIG. 4 is similar to circuit 301 of FIG. 3, with the exception of MagFET 403 being a triple drain MagFET instead of a dual drain MagFET, the center drain 433 of triple drain MagFET 403 is biased with reference current IREF 435 flowing through resistance R. N-channel transistors 405 and 407 are coupled in cascode configuration to lateral drains 415 and 417 respectively. P-channel transistors 409 and 411 are coupled in a current mirror configuration with p-channel transistor 409 coupled to n-channel transistor 405 and p-channel transistor 411 coupled to n-channel transistor 407. Comparator 413 is coupled to sense the differential currents at the drains of n-channel transistors 405 and 407 respectively. The gate of triple drain MagFET 403 is biased with VREF1 421 to a voltage centered around the differential voltage generated at lateral drains 415 and 417. Similar to circuit 301 of FIG. 3, the gates of cascode coupled n-channel transistors 405 and 407 are biased with VREF2 423 which cause the voltage at lateral drains 415 and 417 to be at a threshold voltage less than VREF2 423. The differential currents detected by 413 are output at output 419.

With cascode coupled n-channel transistors 405 and 407 of FIG. 4 and 305 and 307 of FIG. 3, small voltage differentials are amplified immediately into significant changes in differential current. With minimal routing between the drains of the MagFET to the cascode coupled devices, there is minimal opportunity for noise to be coupled into the output differential signal.

In one embodiment of the present invention, the bias point of VREF2 423 of FIG. 4 or 323 of FIG. 3 is precisely adjusted since the voltage at which the gates of the cascode coupled devices are biased strongly influences the input impedance of the cascode devices. It is noted that changes in the input impedance of the cascode coupled transistors significantly alter the degree to which voltage differentials occurring at the drains of the MagFETS are converted into current differentials. Optimally, cascode coupled n-channel transistors 405 and 407 of FIG. 4 and 305 and 305 and 307 of FIG. 3 are biased in a state of very weak inversion. For instance, if VREF2 423 of FIG. 4 or VREF2 323 of FIG. 3 are too high, changes in differential voltage will not result in substantial changes in differential current since the input impedance of cascode coupled devices 405 and 407 of FIG. 4 and 305 and 307 of FIG. 3 will be much lower. Therefore, VREF2 423 is precisely adjusted to place the cascode devices in a state of very weak inversion to maximize input impedance and thus maximize current differentials. It is noted that precisely biasing the cascode devices in a state of very weak inversion may be difficult to achieve in practice since process variations cause the bias point of the cascode devices to swing substantially.

FIG. 5 is a schematic of circuit 501 with bias network 537 providing reference voltages VREF1 521 and VREF2 523 to the gates of dual drain MagFET 503 and cascode coupled n-channel transistors 505 and 507 respectively. Circuit 501 is similar to circuit 301 of FIG. 3 with the exception of bias network 537 providing the reference voltages. Bias network 537 includes a diode coupled dual drain MagFET 541 with diode coupled n-channel transistors 543 and 545.

As shown in FIG. 5, the gate of dual drain MagFET 541 is coupled to its two drains. The gates of n-channel transistors 543 and 545 are coupled to their respective drains. Current source 539 supplies $I_{REF}$ which flows in parallel through n-channel transistors 543 and 545 and then through dual drain MagFET 541. It is noted that in one embodiment of the present invention, dual drain MagFET 541 is well matched with dual drain MagFET 521 and n-channel transistors 543 and 545 are well matched with cascode coupled n-channel transistors 505 and 507.

With the stack of devices included in bias network 537, the precise reference voltages necessary to bias the gates dual drain MagFET 503 and n-channel transistors 505 and 507 are generated at the gates of dual drain MagFET 541 and n-channel transistors 543 and 545 respectively. The reference voltage generated at the gate of dual drain MagFET 541 is centered around the voltage between the two drains 515 and 517 of dual drain MagFET 503. Reference voltage VREF1 521 is precisely generated since the gate of dual drain MagFET 541 is tied to its two drains in a diode configuration. Similarly, VREF2 523 is precisely generated at the gates of n-channel transistors 543 and 545 since the gates of n-channel transistors 543 and 545 are tied to their respective drains in diode configurations as shown in FIG. 5. Since n-channel transistors 543, 545, 505 and 507 are well matched, VREF2 523 is precisely generated to place cascode coupled n-channel transistors 505 and 507 in a state of very weak inversion. With cascode coupled n-channel transistors 505 and 507 in a state of weak inversion, maximum input impedance is realized.

It is appreciated that with the well matched devices utilized by the present invention in the bias network described herein, the present invention is substantially immune to process, temperature, and voltage supply variations since changes in such factors occur uniformly throughout the entire circuit.

FIG. 6 is a schematic of another embodiment of the present invention utilizing a triple drain MagFET with cascode coupled n-channel transistors 605 and 607 coupled to the lateral drains 615 and 617 of triple drain MagFET 603. Circuit 601 is similar to circuit 401 of FIG. 4 with the exception of bias network 637 being used to generate reference voltages VREF1 621 and VREF2 623 to bias the gates of triple drain MagFET 603 and n-channel transistors 605 and 607 respectively.

Similar to bias network 537 of FIG. 5, bias network 637 includes a diode coupled triple drain MagFET 641 and two diode coupled n-channel transistors 643 and 645. The gates of n-channel transistors 643 and 645 are coupled to their respective drains and the gate of triple drain MagFET 641 is coupled to its three drains as shown in FIG. 6. Current source 649 supplies $I_{REF2}$ which flows in parallel through n-channel transistors 643 and 645 and through diode coupled triple drain MagFET 641. Current source 647 supplies a current of $I_{REF1}$ which also flows through diode coupled triple drain MagFET 641. In addition, current source 635 biases the center drain 633 of triple drain MagFET 603 with a current also equal to $I_{REF1}$. That is, the current generated by current sources 635 and 647 are substantially equal. In one embodiment of the present invention, IREF2 is substantially less than $I_{REF1}$.

With the gate of triple drain MagFET 641 tied to its three drains as shown in FIG. 6, the gate of triple drain MagFET 603 is biased to a voltage VREF1 621 which is centered around the voltage between the two respective lateral drains. Similarly, with the gates of n-channel transistors 643 and 645 coupled to their respective drains, the gates of cascode coupled n-channel transistor 605 and 607 are biased to a voltage of VREF2 623 which places the cascode devices in a state of very weak inversion. Therefore, the input impedance of n-channel transistors 605 and 607 is maximized.

In one embodiment of the present invention, triple drain MagFET 641 is exactly matched with triple drain MagFET 603 and n-channel transistor 643 and 645 are exactly matched with cascode coupled n-channel transistor 605 and 607. With the devices so matched, circuit 601 is process, temperature and supply voltage insensitive.

FIG. 7 is a schematic of an alternate embodiment of the present invention using triple drain MagFET 703 and cascode coupled n-channel transistors 705 and 707 coupled to the lateral drains 715 and 717 of triple drain MagFET 703. Circuit 701 includes bias network 737 which includes triple drain MagFET 741 and diode coupled n-channel transistor 743 and 745. Unlike triple drain MagFET 641 of FIG. 6, the gate of triple drain MagFET 741 is tied only to its center drain 753 and not to its two lateral drains 751 and 755. Current source 749 supplies a current equal IREF2 which is split between diode coupled n-channel transistors 743 and 745. One portion Of $I_{REF2}$ flows through diode coupled n-channel transistor 743 and through lateral drain 755 of triple drain MagFET 741 while the other portion Of $I_{REF2}$ flows through diode coupled n-channel transistor 745 and through lateral drain 751 of triple drain MagFET 741. Current source 747 supplies a current equal to $I_{REF1}$ which flows through the center drain 753 of triple drain MagFET 741. Similar to the other embodiments described above, triple drain MagFET 741 is precisely matched with triple drain MagFET 703 and n-channel transistors 743 and 745 are precisely matched with cascode coupled n-channel transistors 705 and 707. The center drain 733 of triple drain MagFET 703 is biased with a current equal to $I_{REF1}$ supplied by current source 735. In one embodiment of the present invention, the currents supplied by current sources 747 and 735 are substantially equal to one another. In addition, the current supplied by current source 749 is substantially less than the currents supplied by either current source 747 or 735.

With the gate of triple drain MagFET 741 tied to its center drain 753, the gate of triple drain MagFET 703 is biased to a reference voltage VREF1 721 which is centered around a voltage between the voltage at the two lateral drains 715 and 717. Similarly, with the gates of n-channel transistors 743 and 745 tied to their respective drains, the gates of cascode coupled n-channel transistors 705 and 707 are biased to a voltage of VREF2 723 which places the cascode coupled n-channel transistors in a state of very weak inversion, thus providing maximum input impedance. With all of the devices being precisely matched, it is also noted that circuit 701 is immune to variations in process, temperature and supply voltage.

In sum, a method and apparatus of cascode coupling MagFETs to measure magnetic field has been described. The cascode coupling of the MagFETs described herein provides immediate conversion and amplification of differential Hall voltages and differential Hall currents with minimum noise. With the biasing network described herein, reference voltages needed to bias precisely the MagFETs and cascode coupled devices described herein are generated. Furthermore, the circuit described herein is exceptionally independent of process, temperature and voltage supply variations by using precisely matched devices. The present invention has been described with reference to specific exemplary embodiments thereof. It will, however, be evident that various modifications and changes may be made thereto without departing from the broader spirit and scope of the present invention. The present specification and drawings are accordingly to be regarded as illustrative rather than restrictive.

I claim:

1. An apparatus for measuring a magnetic field, the apparatus comprising:
   a first magnetic field effect transistor (MagFET) having a gate, a first drain and a second drain, the gate of the first MagFET configured to be biased at a first reference voltage;
   a comparison circuit having first and second inputs, the first and second inputs coupled to the first and second drains of the first MagFET respectively, the comparison circuit comparing the first and second drains of the first MagFET and generating an output in response to the magnetic field; and
   first and second transistors coupled in a cascode configuration between the first input of the comparison circuit and the first drain of the first MagFET and the second input of the comparison circuit and the second drain of the first MagFET, respectively, the first and second transistors having gates configured to be biased at a second reference voltage.

2. The apparatus described in claim 1 further comprising a load coupled between a first voltage and the first and second transistors, the load having first and second current paths, the first and second current paths coupled to the first and second transistors respectively.

3. The apparatus described in claim 2 wherein the load is a current mirror having the two current paths.

4. The apparatus described in claim 1 wherein the first MagFET further includes a center drain, the center drain configured to sink a first reference current.

5. The apparatus described in claim 1 further comprising a bias network configured to provide the first and second reference voltages wherein the second reference voltage is configured to bias the first and second transistors near threshold.

6. The apparatus described in claim 5 wherein the bias network comprises:
   third and fourth transistors coupled in parallel in a diode configuration;
   a second current source coupled between a first voltage and the third and fourth transistors, the second current source providing a second reference current, wherein the second reference voltage is generated at gates of the third and fourth transistors; and
   a second MagFET having first and second drains, the first and second drains of the second MagFET coupled together to the third and fourth transistors, wherein the first reference voltage is generated at a gate of the second MagFET.

7. The apparatus described in claim 4 further comprising a first current source coupled between a first voltage and the center drain of the first MagFET, the first current source configured to provide the first reference current.

8. The apparatus described in claim 7 further comprising a bias network configured to provide the first and second reference voltages wherein the second reference voltage is configured to bias the first and second transistors to operate near threshold.

9. The apparatus described in claim 8 wherein the first reference voltage is configured to bias the gate of the first MagFET between voltages of the first and second drains of the first MagFET.

10. The apparatus described in claim 9 wherein the bias network comprises:

third and fourth transistors coupled in parallel in a diode configuration;

a second current source coupled between the first voltage and the third and fourth transistors, the second current source providing a second reference current, wherein the second reference voltage is generated at gates of the third and fourth transistors;

a second MagFET having a gate, first, second and center drains, the gate, first, second and center drains of the second MagFET coupled together to the third and fourth transistors, wherein the first reference voltage is generated at the gate of the second MagFET; and a third current source coupled between the first voltage and the gate, first, second and center drains of the second MagFET, the third current source providing a third reference current, wherein the third reference current is substantially equal to the first reference current, wherein the first, second and center drains of the second MagFET are configured to conduct the second and third reference currents.

11. The apparatus described in claim 9 wherein the bias network comprises:

third and fourth transistors coupled in parallel in a diode configuration;

a second current source coupled between the first voltage and the third and fourth transistors, the second current source providing a second reference current, wherein the second reference voltage is generated at gates of the third and fourth transistors;

a second MagFET having a gate, first, second and center drains, the first drain of the second MagFET coupled to the third transistor and the second drain of the second MagFET coupled to the fourth transistor; and a third current source coupled between the first voltage and the gate and a center drain of the second MagFET, the third current source providing a third reference current, wherein the third reference current is substantially equal to the first reference current, wherein the first reference voltage is generated at the gate of the second MagFET.

12. A method for measuring magnetic field, the method comprising the steps of:

biasing a gate of a first magnetic field effect transistor (MagFET) to a first reference voltage, the MagFET having first and second drains, wherein the first reference voltage is configured to bias the gate of the first MagFET between voltages of the first and second drains;

biasing gates of first and second transistors to a second reference voltage, the first and second transistors coupled to the first and second drains of the first MagFET, respectively, the first and second transistors coupled in a cascode configuration, wherein the first and second transistors are biased to operate near threshold such that a differential voltage between the first and second drains of the first MagFET generated in response to the magnetic field is amplified.

13. The method described in claim 11 including the additional step of amplifying a differential voltage between drains of the first and second transistors, wherein the step of amplifying the differential voltage is performed with a load coupled between the first and second transistors and a first voltage, the load having first and second current paths, the first and second current paths coupled to the first and second transistors respectively.

14. The method described in claim 12 including the additional step of measuring the differential voltage.

15. The method described in claim 11 wherein the first and second reference voltages are generated with bias network.

16. The method described in claim 14 wherein the bias network comprises:

third and fourth transistors coupled in parallel in a diode configuration;

a second current source coupled between a first voltage and the third and fourth transistors, the second current source providing a second reference current, wherein the second reference voltage is generated at gates of the third and fourth transistors; and a second MagFET having first and second drains, the first and second drains of the second MagFET coupled together to the third and fourth transistors, wherein the first reference voltage is generated at a gate of the second MagFET.

17. The method described in claim 11 including the additional step of biasing a center drain of the first MagFET with a first reference current.

18. The method described in claim 16 wherein the first reference current is generated with a first current source coupled between a first voltage and the center drain of the first MagFET.

19. The method described in claim 17 wherein the first and second reference voltages are generated with bias network, the bias network comprising:

third and fourth transistors coupled in parallel in a diode configuration;

a second current source coupled between the first voltage and the third and fourth transistors, the second current source providing a second reference current, wherein the second reference voltage is generated at gates of the third and fourth transistors;

a second MagFET having a gate, first, second and center drains, the gate, first, second and center drains of the second MagFET coupled together to the third and fourth transistors, wherein the first reference voltage is generated at the gate of the second MagFET; and a third current source coupled between the first voltage and the gate, first, second and center drains of the second MagFET, the third current source providing a third reference current, wherein the third reference current is substantially equal to the first reference current, wherein the first, second and center drains of the second MagFET are configured to conduct the second and third reference currents.

20. The method described in claim 17 wherein the first and second reference voltages are generated with bias network, the bias network comprising:

third and fourth transistors coupled in parallel in a diode configuration;

a second current source coupled between the first voltage and the third and fourth transistors, the second current source providing a second reference current, wherein the second reference voltage is generated at gates of the third and fourth transistors;

a second MagFET having a gate, first, second and center drains, the first drain of the second MagFET coupled to the third transistor and the second drain of the second MagFET coupled to the fourth transistor; and a third current source coupled between the first voltage and the gate and a center drain of the second MagFET, the third current source providing a third reference current, wherein the third reference current is substantially equal to the first reference current, wherein the first reference voltage is generated at the gate of the second MagFET.

* * * * *